(12) United States Patent
Ma

(10) Patent No.: US 9,318,067 B2
(45) Date of Patent: Apr. 19, 2016

(54) SHIFT REGISTER UNIT AND GATE DRIVING CIRCUIT

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Lei Ma, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 147 days.

(21) Appl. No.: 14/361,462

(22) PCT Filed: Apr. 16, 2013

(86) PCT No.: PCT/CN2013/074253
§ 371 (c)(1),
(2) Date: May 29, 2014

(87) PCT Pub. No.: WO2014/131229
PCT Pub. Date: Sep. 4, 2014

(65) Prior Publication Data
US 2015/0269899 A1 Sep. 24, 2015

(30) Foreign Application Priority Data
Feb. 28, 2013 (CN) .......................... 2013 1 0064289

(51) Int. Cl.
G11C 19/00 (2006.01)
G09G 3/36 (2006.01)
(Continued)

(52) U.S. Cl.
CPC ............... *G09G 3/3674* (2013.01); *G09G 3/20* (2013.01); *G11C 19/28* (2013.01); *G09G 2310/0267* (2013.01); *G09G 2310/0286* (2013.01); *G09G 2310/08* (2013.01); *G09G 2330/00* (2013.01)

(58) Field of Classification Search
None
See application file for complete search history.

(56) References Cited

U.S. PATENT DOCUMENTS 7,203,264 B2 * 4/2007 Lo ........................... G11C 19/28
345/100
7,764,761 B2 * 7/2010 Shih ...................... G09G 3/3677
377/64

(Continued)

FOREIGN PATENT DOCUMENTS

CN 101000417 A 7/2007
CN 102682699 A 9/2012

(Continued)

OTHER PUBLICATIONS

International Preliminary Report on Patentability Appln. No. PCT/CN2013/074253; Dated Sep. 1, 2015.
(Continued)

Primary Examiner — Tuan T Lam
(74) Attorney, Agent, or Firm — Ladas & Parry LLP

(57) ABSTRACT

A shift register unit and a gate driving circuit are configured to reduce size of the shift register unit and meanwhile to provide a stable output signal. The shift register unit includes: an input unit configured to supply an input signal to an output unit in response to the input signal; the output unit configured to supply a first clock signal to an output terminal in response to a voltage at the first node; a pull-up unit configured to supply the first clock signal to the first node in response to the voltage at the first node; a pull-down control unit configured to supply the first clock signal, a second clock signal and a negative voltage of a power supply to the pull-down unit in response to the first clock signal, the second clock signal and the voltage at the first node; and the pull-down unit configured to supply the negative voltage of the power supply to the first node and the output terminal in response to a voltage at the second node.

20 Claims, 3 Drawing Sheets

(51) Int. Cl.
*G09G 3/20* (2006.01)
*G11C 19/28* (2006.01)

(56) References Cited

U.S. PATENT DOCUMENTS

| | | | | |
|---|---|---|---|---|
| 7,978,809 B2 * | 7/2011 | Lai | ............. | G11C 19/28 |
| | | | | 377/64 |
| 8,102,962 B2 * | 1/2012 | Liu | ............. | G11C 19/28 |
| | | | | 377/64 |
| 2007/0171115 A1 | 7/2007 | Kim et al. | | |
| 2012/0113088 A1 * | 5/2012 | Han | ............. | G09G 3/3674 |
| | | | | 345/212 |
| 2013/0136244 A1 * | 5/2013 | Kritt | ............. | H04M 3/493 |
| | | | | 379/88.13 |
| 2013/0272487 A1 * | 10/2013 | Tobita | ............. | G09G 3/3677 |
| | | | | 377/79 |
| 2014/0064438 A1 * | 3/2014 | Wu | ............. | G09G 3/3266 |
| | | | | 377/64 |
| 2014/0072093 A1 | 3/2014 | Shang et al. | | |
| 2014/0079173 A1 | 3/2014 | Yan et al. | | |
| 2014/0086379 A1 * | 3/2014 | Ma | ............. | G11C 19/28 |
| | | | | 377/64 |
| 2014/0093027 A1 * | 4/2014 | Jang | ............. | G11C 5/005 |
| | | | | 377/64 |
| 2014/0119491 A1 * | 5/2014 | Liu | ............. | G11C 19/28 |
| | | | | 377/64 |

FOREIGN PATENT DOCUMENTS

| | | |
|---|---|---|
| CN | 102708818 A | 10/2012 |
| CN | 102708926 A | 10/2012 |

OTHER PUBLICATIONS

Second Chinese Office Action dated Nov. 25, 2014; Appln. No. 201310064289.9

Chinese Rejection Decision dated Mar. 19, 2015; Appln. No. 201310064289.9.

International Search Report dated Oct. 25, 2013; PCT/CN2013/074253.

First Chinese Office Action dated Jul. 3, 2014; Appln. No. 201310064289.9.

* cited by examiner

SHIFT REGISTER UNIT AND GATE DRIVING CIRCUIT

TECHNICAL FIELD

The present disclosure relates to the field of liquid crystal display technique, and particularly to a shift register unit and a gate driving circuit.

BACKGROUND

A driver for a Thin Film Transistor Liquid Crystal Display (TFT-LCD) mainly comprises a gate driver and a data driver, wherein the gate driver converts an inputted clock signal via a shift register unit and then applies the same to a gate line on a liquid crystal display (LCD) panel; and a gate driving circuit of the gate driver can be formed on the LCD panel together with TFTs at the same time under a same process. The gate driving circuit comprises a plurality of stages of shift register units, and each stage of shift register unit is connected to a corresponding gate line to output a gate driving signal.

The gate driving circuit with the above structure is arranged on the LCD panel, and each stage of shift register unit comprises a structure as shown in FIG. 1. The shift register unit shown in FIG. 1 comprises a storage capacitor C1 and a TFT M3 configured to supply a first clock signal CLK to an output terminal OUTPUT in response to a voltage at a pull-up node PU. Here, the storage capacitor C1 mainly functions as supplying a relative stable voltage to the pull-up node PU so that it is ensured that a stable signal is outputted. The TFT M3 has a large size, that is, it has a thick depletion layer; and the thick depletion layer can reduce an influence of the couple capacitance in the TFT, and can further improve the stability of the output signal and maintain the voltage at the output terminal. At the same time, the shift register unit shown in FIG. 1 further comprises six signals (INPUT, CLK, CLKB, VDD, VSS and VGL) functioning as control signals for achieving the output and reset functions of the shift register unit.

However, the introduction of the storage capacitor C1, the increase of the size of the TFT M3 and more control signals lead to a larger wiring space, so that the shift register unit as a whole is larger in size and thus the liquid crystal display is larger in volume.

SUMMARY

In embodiments of the present disclosure, there are provided a shift register unit and a gate driving circuit, which can reduce the size of the shift register unit and at the same time can provide a stable output signal and maintain a potential at the output terminal effectively.

The shift register unit provided in the embodiments of the present disclosure comprises an input unit, an output unit, a pull-up unit, a pull-down control unit and a pull-down unit. The input unit is connected to an input signal terminal and is configured to supply an input signal to the output unit via a first node in response to the input signal, wherein the first node functions as a connection point between the input unit and the output unit. The output unit is configured to supply a first clock signal to an output terminal in response to a voltage at the first node. The pull-up unit is configured to supply the first clock signal to the first node in response to the voltage at the first node. The pull-down control unit is configured to supply the first clock signal and a second clock signal to the pull-down unit via a second node as an output terminal of the pull-down control unit in response to the first clock signal and the second clock signal; and is configured to supply a negative voltage of a power supply to the second node in response to the voltage at the first node, wherein the second node functions as a connection point between the pull-down control unit and the pull-down unit. The pull-down unit is configured to supply the negative voltage of the power supply to the first node and the output terminal in response to a voltage at the second node.

The gate driving circuit provided in the embodiments of the present disclosure comprises a plurality of stages of shift register units in a cascade connection, wherein an input signal terminal of a first stage of shift register unit is connected to a start signal terminal, an input signal terminal of each stage of shift register unit except for the first stage of shift register unit is connected to an output terminal of its previous stage of shift register unit; and all the shift register units in the cascade connection are the shift register units as described above.

According to the embodiments of the present disclosure, the shift register unit provided comprising the input unit, the output unit, the pull-up unit, the pull-down control unit and the pull-down unit. The input unit is connected to an input signal terminal and is configured to supply an input signal to the output unit in response to the input signal. The output unit is connected to a first node in the input unit as an output terminal of the input unit and is configured to supply a first clock signal to an output terminal in response to a voltage at the first node. The pull-up unit is connected to the first node in the input unit as the output terminal of the input unit and is configured to supply the first clock signal to the output unit and the first node in response to the voltage at the first node. The pull-down control unit is configured to supply the first clock signal, a second clock signal and a negative voltage of a power supply to the pull-down unit via a second node as an output terminal of the pull-down control unit in response to the first clock signal, the second clock signal and the input signal. The pull-down unit is configured to supply the negative voltage of the power supply to the first node and the output terminal in response to a voltage at the second node.

The introduction of the pull-up unit in the shift register unit provided in the embodiments of the present disclosure provides a stable voltage for the first node, so that the shift register unit can provide a stable output signal and at the same time can maintain the potential at the output terminal effectively. Further, since the storage capacitor C1 and the TFT M3 with a large size shown in FIG. 1 do not exist in the shift register unit, the wiring space is saved, the size of the shift register unit is reduced and thus the volume of a whole liquid crystal display can be reduced.

DETAILED DESCRIPTION OF THE PREFERRED EMBODIMENTS

In the embodiments of the present disclosure, there are provided a shift register unit and a gate driving circuit, which can reduce the size of the shift register unit and at the same time can provide a stable output signal and maintain a potential at the output terminal effectively.

Hereinafter, a description is given to the embodiments of the present disclosure with reference to the accompanying drawings.

Figure 2:
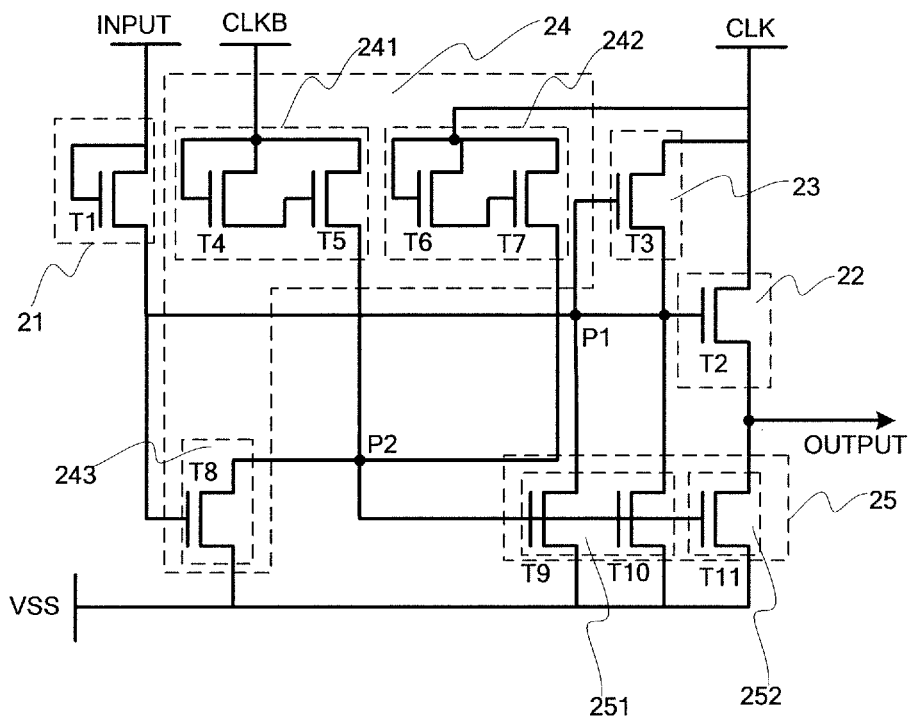
FIG. 2 is a schematic diagram showing a structure of a shift register unit provided in an embodiment of the present disclosure.

FIG. 2 shows a structure of the shift register unit provided in an embodiment of the present disclosure, and it can be seen, from FIG. 2, that the shift register unit comprises an input unit 21, an output unit 22, a pull-up unit 23, a pull-down control unit 24 and a pull-down unit 25.

The input unit 21 is connected to an input signal terminal and is configured to supply an input signal to the output unit 22 via a first node in response to the input signal.

The output unit 22 is configured to supply a first clock signal to an output terminal in response to a voltage at the first node.

The pull-up unit 23 is configured to supply the first clock signal to the first node in response to the voltage at the first node.

The pull-down control unit 24 is configured to supply the first clock signal and a second clock signal to the pull-down unit via a second node as an output terminal of the pull-down control unit 24 in response to the first clock signal and the second clock signal; and is configured to supply a negative voltage of a power supply to the second node in response to the voltage at the first node.

The pull-down unit 25 is configured to supply the negative voltage of the power supply to the first node and the output terminal in response to a voltage at the second node.

Hereinafter, detailed descriptions will be given to the present disclosure in connection with the specific embodiments of the present disclosure. It should be noted that the specific embodiments of the present disclosure are merely used for illustrating the present disclosure and do not limit the present disclosure in any way.

The shift register unit shown in FIG. 2 comprises the input unit 21, the output 22, the pull-up unit 23, the pull-down control unit 24 and the pull-down unit 25; the pull-down control unit 24 comprises a first pull-down control unit 241, a second pull-down control unit 242 and a third pull-down control unit 243; and the pull-down unit 25 comprises a first pull-down unit 251 and a second pull-down unit 252.

The input unit 21 comprises a first TFT T1 having a gate and a drain connected to the input signal terminal INPUT, and a source connected to the first node P1.

The output unit 22 comprises a second TFT T2 having a gate connected to the first node P1, a drain configured to receive the first clock signal CLK, and a source connected to the output terminal OUTPUT.

The pull-up unit 23 comprises a third TFT T3 having a gate and a source connected to the first node P1, and a drain configured to receive the first clock signal CLK.

The first pull-down control unit 241 comprises a fourth TFT T4 and a fifth TFT T5, the fourth TFT T4 has a gate and a drain configured to receive the second clock signal CLKB, and a source connected to a gate of the fifth TFT T5; and a drain of the fifth TFT T5 is configured to receive the second clock signal CLKB, and a source thereof is connected the second node P2.

The second pull-down control unit 242 comprises a sixth TFT T6 and a seventh TFT T7, the sixth TFT T6 has a gate and a drain configured to receive the first clock signal CLK, and a source connected to a gate of the seventh TFT T7; and a drain of the seventh TFT T7 is configured to receive the first clock signal CLK, and a source thereof is connected the second node P2.

The third pull-down control unit 243 comprises an eighth TFT T8 having a gate connected to the first node P1, a drain connected to the second node P2, and a source connected to a negative voltage terminal VSS of the power supply.

The first pull-down unit 251 comprises a ninth TFT T9 and a tenth TFT T10, the ninth TFT T9 has a gate connected to the second node P2, a drain connected to the first node P1, and a source connected to the negative voltage terminal VSS of the power supply; and the tenth TFT T10 has a gate connected to the second node P2, a drain connected to the first node P1, and a source connected to the negative voltage terminal VSS of the power supply.

The second pull-down unit 252 comprises an eleventh TFT T11 having a gate connected to the second node P2, a drain connected to the output terminal OUTPUT, and a source connected to the negative voltage terminal VSS of the power supply.

Optionally, all the TFTs as above are N type TFTs.

Figure 1:
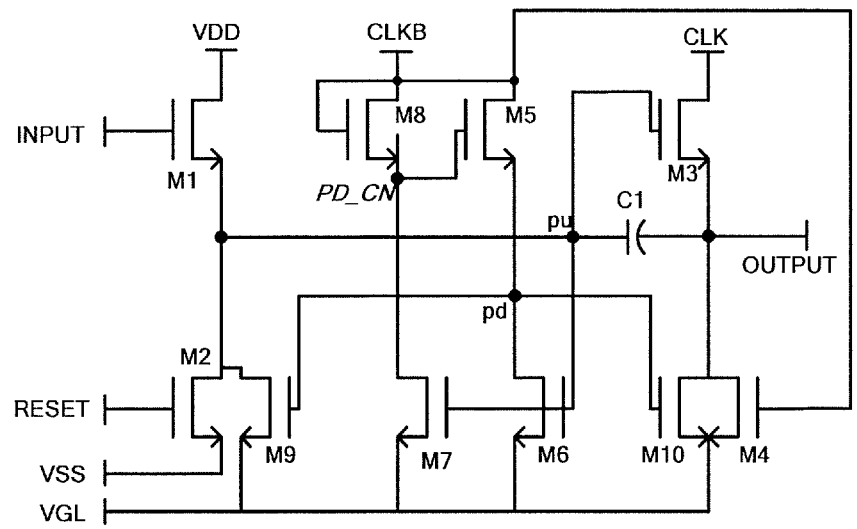
FIG. 1 is a schematic diagram showing a structure of a basic unit of a shift register unit in the prior art.

Compared to the shift register unit shown in FIG. 1, in the shift register unit shown in FIG. 2, since the introduction of the TFT T3 can improve the stability of the voltage at the first node, it is unnecessary to arrange the storage capacitor C1. At the same time, since the serial connection of the TFT T3 and TFT T2, a stable control voltage can be supplied to the gate of the second TFT T2, and the effect of the coupling capacitance in the second TFT T2 can be reduced, therefore the size of the second TFT T2 can be reduced, a stable output signal can be supplied, and the potential at the output terminal can be maintained effectively. Further, in the shift register unit shown in FIG. 2, only four signals (INPUT, CLK, CLKB and VSS) are needed, and the wiring space can be further saved, thus facilitating the reduction of the liquid crystal display in volume. It should be indicated that the reduction of the TFT T2 in size also depends on its load; for example, the incorporation of TFT T3 in the shift register unit can reduce the size of the TFT T2 by about 5% with the same load.

The above shift register units can be connected in cascade to form a gate driving circuit on an array substrate. The gate driving circuit provided in an embodiment of the present disclosure comprises a plurality of stages of shift register units in a cascade connection, wherein an input signal terminal of a first stage of shift register unit is connected to a start signal terminal, an input signal terminal of each stage of shift register unit other than the first stage of shift register unit is connected to an output terminal of its previous stage of shift register unit; and all the shift register units in the cascade connection are the shift register units as described above.

Figure 3:
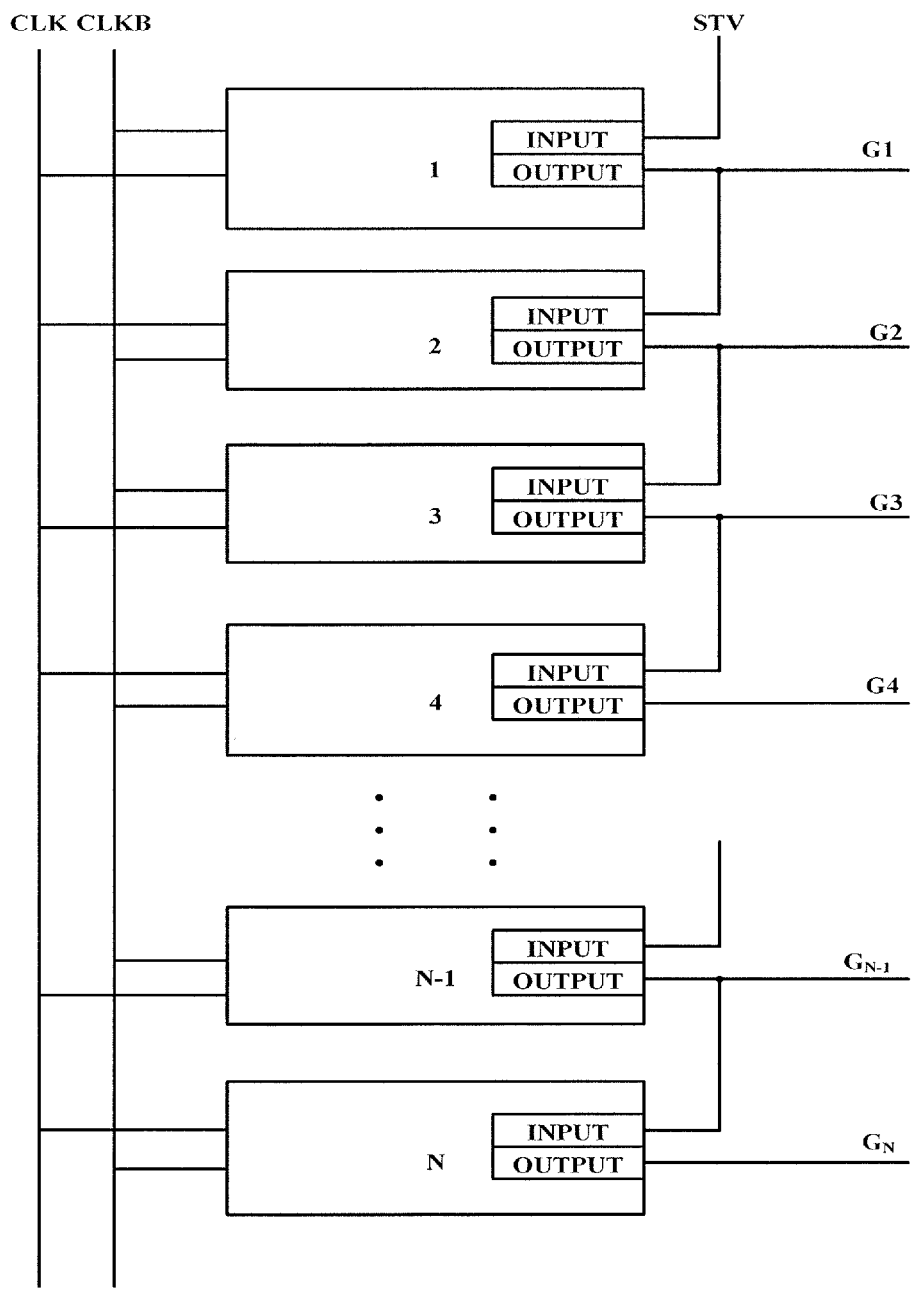
FIG. 3 is a schematic diagram showing a structure of a gate driving circuit provided in an embodiment of the present disclosure.

In particular, the gate driving circuit on the array substrate comprises N stages of shift register units, and N represents the number of gate lines. As shown in FIG. 3, a start signal STV is inputted to the first stage of shift register unit as an input signal, and an output signal of an $(n-1)^{th}$ stage of shift register unit is provided as an input signal of an $n^{th}$ stage of shift register unit, wherein n<N. Further, each stage of shift register further outputs an output signal to a corresponding gate line as a gate driving signal.

Figure 4:
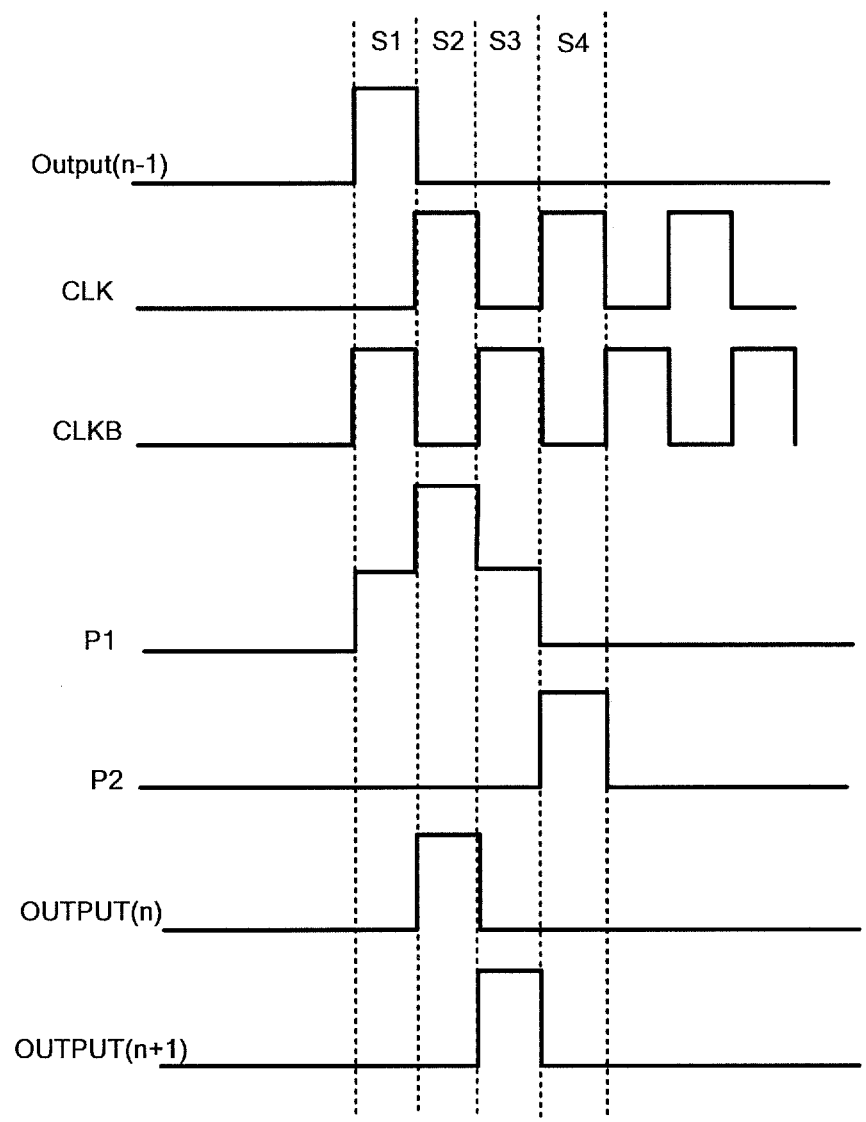
FIG. 4 is a timing diagram of signals at respective signal terminals of a shift register unit provided in an embodiment of the present disclosure.

FIG. 4 is a timing diagram of the signals at the respective signal terminals. A description will be given to the operational process of the $n^{th}$ stage of shift register unit (n<N, N representing the number of the stages in the gate driving circuit on the array substrate) in the gate driving circuit on the array substrate provided in the embodiments of the present disclosure with reference to FIG. 4, wherein each of the TFTs is turned on when a high level signal is input to the gate thereof, and is turned off when a low level signal is input to the gate thereof. At an initial timing, the signals at all the signal terminals are at a low level, and the output terminal is also at a low level.

In a first period S1, the first clock signal CLK is at a low level, and the second clock signal CLKB is at a high level; at this time, an output signal Output(n−1) at an output signal terminal G(n−1) of a previous stage of shift register unit functions as an input signal and is at a high level. The TFT T1 is turned on by the input signal at a high level (i.e., the output signal Output(n−1) at the output signal terminal G(n−1) of the previous stage of shift register unit) and the first node P1 is charged, so that the first node P1 is at a high level. At this time, the second TFT T2 is also turned on, and an output terminal G(n) outputs a low level since the clock signal CLK is at a low level at this time.

The second clock signal CLKB at a high level charges the second node P2 via the first pull-down control unit 241, however, since the eighth TFT T8 is also in a turn-on state in response to the voltage at the first node P1, the second node P2 is discharged via the eighth TFT T8, and thus the second node P2 is still at a low level.

In a second period S2, the first clock signal CLK is at a high level, the second clock signal CLKB is at a low level, and the input signal (i.e., the output signal Output(n−1) at the output signal terminal G(n−1) of the previous stage of shift register unit) is at a low level. The first clock signal CLK at a high level charges the second node P2 via the second pull-down control unit 242; however, since the eighth TFT T8 is still in a turn-on state in response to the voltage at the first node P1, the second node P2 is discharged via the eighth TFT T8, and thus the second node P2 is still at a low level. Since the first node P1 is at a high level, at this time, the second TFT T2 and the third TFT T3 are also in a turn-on state, thus the first clock signal CLK continues to charge the first node P1 via the third TFT T3, so that the high level voltage at the first node P1 continues to be pulled up, and the output terminal G(n) outputs a high level.

In a third period S3, the first clock signal CLK is at a low level, the second clock signal CLKB is at a high level, and the input signal (i.e., the output signal Output(n−1) at the output signal terminal G(n−1) of the previous stage of shift register unit) is at a low level. The second clock signal CLKB at a high level charges the second node P2 via the first pull-down control unit 241; however, since the eighth TFT T8 is still in a turn-on state in response to the voltage at the first node P1, the second node P2 is discharged via the eighth TFT T8, and thus the second node P2 is still at a low level. Meanwhile, the power consumption of the TFTs which operate in response to the voltage at the first node P1 causes the voltage at the first node P1 to be decreased. However, since the first node P1 is still at a high level, the second TFT T2 and the third TFT T3 are both in a turn-on state, and the output terminal G(n) outputs a low level.

In a fourth period S4, the first clock signal CLK is at a high level, the second clock signal CLKB is at a low level, and the input signal (i.e., the output signal Output(n−1) at the output signal terminal G(n−1) of the previous stage of shift register unit) is at a low level. The first node P1 continues to be discharged, so that the second TFT T2, the third TFT T3 and the eighth TFT T8 which operate in response to the voltage at the first node P1 are in a turn-off state. Meanwhile, the second node P2 is at a high level provided by the CLK, and the ninth TFT T9, the tenth TFT T10 and the eleventh TFT T11 which operate in response to the voltage at the second node P2 are turned on. At this time, the first pull-down unit 251 discharges the first node P1 quickly via the ninth TFT T9 and the tenth TFT T10, and discharges the output terminal via the eleventh TFT T11, and thus the output terminal G(n) outputs a low level.

In summary, the shift register unit provided in the embodiments of the present disclosure comprises the input unit, the output unit, the pull-up unit, the pull-down control unit and the pull-down unit. The input unit is connected to an input signal terminal and is configured to supply an input signal to the output unit in response to the input signal. The output unit is connected to the first node in the input unit as the output terminal of the input unit and is configured to supply a first clock signal to an output terminal in response to a voltage at the first node. The pull-up unit is connected to the first node in the input unit as the output terminal of the input unit and is configured to supply the first clock signal to the output unit and the first node in response to the voltage at the first node. The pull-down control unit is configured to supply the first clock signal, a second clock signal and a negative voltage of a power supply to the pull-down unit via a second node as an output terminal of the pull-down control unit in response to the first clock signal, the second clock signal and the input signal. The pull-down unit is configured to supply the negative voltage of the power supply to the first node and the output terminal in response to a voltage at the second node. The introduction of the third TFT in the shift register unit allows a stable output signal to be supplied without the storage capacitor and a TFT in large size in the shift register unit, and thus the potential at the output terminal can be maintained effectively; secondly, since the storage capacitor C1 and the TFT M3 in a large size shown in FIG. 1 do not exist in the shift register unit, the wiring space is saved, thus facilitating the reduction of the liquid crystal display in volume; further, only four signals are needed in the shift register unit, the wiring space is further saved, and the manufacture cost is decreased.

It will be obvious that those skilled in the art may make modifications, variations to the above embodiments without departing from the spirit and scope of the present disclosure. Such modifications and variations are intended to be included within the spirit and scope of the present disclosure provided that the modifications and variations belong to the scope of the claims of the present disclosure and the equivalence thereof.

What is claimed is:

1. A shift register unit comprising an input unit, an output unit, a pull-up unit, a pull-down control unit and a pull-down unit; wherein the input unit is connected to an input signal terminal and is configured to supply an input signal to the output unit via a first node in response to the input signal, wherein the first node functions as a connection point between the input unit and the output unit;

the output unit is configured to supply a first clock signal to an output terminal in response to a voltage at the first node;

the pull-up unit is configured to supply the first clock signal to the first node in response to the voltage at the first node;

the pull-down control unit is configured to supply the first clock signal and a second clock signal to the pull-down unit via a second node as an output terminal of the pull-down control unit in response to the first clock signal and the second clock signal; and is configured to supply a negative voltage of a power supply to the second node in response to the voltage at the first node, wherein the second node functions as a connection point between the pull-down control unit and the pull-down unit; and the pull-down unit is configured to supply the negative voltage of the power supply to the first node and the output terminal in response to a voltage at the second node.

2. The shift register unit of claim 1, wherein the pull-down control unit comprises a first pull-down control unit, a second pull-down control unit and a third pull-down control unit; wherein the first pull-down control unit is configured to output the second clock signal via the second node in response to the second clock signal;

the second pull-down control unit is connected to the first pull-down control unit via the second node and is configured to supply the first clock signal to the second node in response to the first clock signal; and the third pull-down control unit is connected to the first pull-down control unit via the second node and is configured to receive the negative voltage of the power supply and to supply the negative voltage of the power supply to the second node in response to the voltage at the first node.

3. The shift register unit of claim 2, wherein the first pull-down control unit comprises a fourth TFT and a fifth TFT, wherein the fourth TFT has a gate and a drain configured to receive the second clock signal, and a source connected to a gate of the fifth TFT; and a drain of the fifth TFT is configured to receive the second clock signal, and a source thereof is connected to the second node.

4. The shift register unit of claim 2, wherein the second pull-down control unit comprises a sixth TFT and a seventh TFT, wherein the sixth TFT has a gate and a drain configured to receive the first clock signal, and a source connected to a gate of the seventh TFT; and a drain of the seventh TFT is configured to receive the first clock signal, and a source thereof is connected to the second node.

5. The shift register unit of claim 2, wherein the third pull-down control unit comprises an eighth TFT having a gate connected to the first node, a drain connected to the second node, and a source configured to receive the negative voltage of the power supply.

6. The shift register unit of claim 1, wherein the pull-down unit comprises a first pull-down unit and a second pull-down unit, wherein the first pull-down unit is configured to supply the negative voltage of the power supply to the first node in response to the voltage at the second node; and the second pull-down unit is configured to supply the negative voltage of the power supply to the output terminal in response to the voltage at the second node.

7. The shift register unit of claim 6, wherein he first pull-down unit comprises a ninth TFT and a tenth TFT, wherein the ninth TFT has a gate connected to the second node, a drain connected to the first node, and a source configured to receive the negative voltage of the power supply; and the tenth TFT has a gate connected to the second node, a drain connected to the first node, and a source connected to the negative voltage of the power supply.

8. The shift register unit of claim claim 6, wherein the second pull-down unit comprises an eleventh TFT having a gate connected to the second node, a drain connected to the output terminal, and a source configured to receive the negative voltage of the power supply.

9. The shift register unit of claim 1, wherein the input unit comprises a first TFT having a gate and a drain configured to receive the input signal, and a source connected to the first node.

10. The shift register unit of claim 1, wherein the output unit comprises a second TFT having a gate connected to the first node, a drain configured to receive the first clock signal, and a source connected to the output terminal.

11. The shift register unit of claim 1, wherein the pull-up unit comprises a third TFT having a gate and a source connected to the first node, and a drain configured to receive the first clock signal.

12. The shift register unit of claim 1, wherein all the TFTs are N type TFTs.

13. A gate driving circuit comprising a plurality stages of shift register units in a cascade connection, wherein an input signal terminal of a first stage of shift register unit is connected to a start signal terminal, an input signal terminal of each stage of shift register unit other than the first stage of shift register unit is connected to an output terminal of its previous stage of shift register unit; and all the shift register units in the cascade connection are the shift register units of claim 1.

14. The gate driving circuit of claim 13, wherein the pull-down control unit comprises a first pull-down control unit, a second pull-down control unit and a third pull-down control unit; wherein the first pull-down control unit is configured to output the second clock signal via the second node in response to the second clock signal;

the second pull-down control unit is connected to the first pull-down control unit via the second node and is configured to supply the first clock signal to the second node in response to the first clock signal; and the third pull-down control unit is connected to the first pull-down control unit via the second node and is configured to receive the negative voltage of the power supply and to supply the negative voltage of the power supply to the second node in response to the voltage at the first node.

15. The gate driving circuit of claim 14, wherein the first pull-down control unit comprises a fourth TFT and a fifth TFT, wherein the fourth TFT has a gate and a drain configured to receive the second clock signal, and a source connected to a gate of the fifth TFT; and a drain of the fifth TFT is configured to receive the second clock signal, and a source thereof is connected to the second node;

the second pull-down control unit comprises a sixth TFT and a seventh TFT, wherein the sixth TFT has a gate and a drain configured to receive the first clock signal, and a source connected to a gate of the seventh TFT; and a drain of the seventh TFT is configured to receive the first clock signal, and a source thereof is connected to the second node; and the third pull-down control unit comprises an eighth TFT having a gate connected to the first node, a drain connected to the second node, and a source configured to receive the negative voltage of the power supply.

16. The gate driving circuit of claim 13, wherein the pull-down unit comprises a first pull-down unit and a second pull-down unit, wherein the first pull-down unit is configured to supply the negative voltage of the power supply to the first node in response to the voltage at the second node; and the second pull-down unit is configured to supply the negative voltage of the power supply to the output terminal in response to the voltage at the second node.

17. The gate driving circuit of claim 16, wherein the first pull-down unit comprises a ninth TFT and a tenth TFT, wherein the ninth TFT has a gate connected to the second node, a drain connected to the first node, and a source configured to receive the negative voltage of the power supply; and the tenth TFT has a gate connected to the second node, a drain connected to the first node, and a source connected to the negative voltage of the power supply; and the second pull-down unit comprises an eleventh TFT having a gate connected to the second node, a drain connected to the output terminal, and a source configured to receive the negative voltage of the power supply.

18. The gate driving circuit of claim 13, wherein the input unit comprises a first TFT having a gate and a drain configured to receive the input signal, and a source connected to the first node.

19. The gate driving circuit of claim 13, wherein the output unit comprises a second TFT having a gate connected to the first node, a drain configured to receive the first clock signal, and a source connected to the output terminal.

20. The gate driving circuit of claim 13, wherein the pull-up unit comprises a third TFT having a gate and a source connected to the first node, and a drain configured to receive the first clock signal.

\* \* \* \* \*